(12) United States Patent
Lee

(10) Patent No.: US 8,815,632 B2
(45) Date of Patent: Aug. 26, 2014

(54) ORDER VACANCY COMPOUND AND METHOD OF MANUFACTURING THE SAME

(71) Applicant: National Cheng-Kung University, Tainan (TW)

(72) Inventor: Wen-Hsi Lee, Kaohsiung (TW)

(73) Assignee: National Chen-Kung University, Tainan (TW)

( * ) Notice: Subject to any disclaimer, the term of this patent is extended or adjusted under 35 U.S.C. 154(b) by 0 days.

(21) Appl. No.: 13/689,536

(22) Filed: Nov. 29, 2012

(65) Prior Publication Data

US 2014/0145308 A1     May 29, 2014

(51) Int. Cl.
*H01L 21/00*     (2006.01)

(52) U.S. Cl.
USPC ............. 438/95; 136/243; 136/252; 136/264; 136/265; 257/E21.068; 257/E21.09; 257/E21.215; 257/E21.216; 438/57; 438/84; 438/93; 438/94; 438/478

(58) Field of Classification Search
USPC .......... 136/243, 252, 264, 265; 257/E21.068, 257/E21.09, E21.215, E21.216; 438/57, 84, 438/93, 94, 95, 478
See application file for complete search history.

(56) References Cited

U.S. PATENT DOCUMENTS

| | | | |
|---|---|---|---|
| 2009/0242029 A1* | 10/2009 | Paulson et al. | 136/260 |
| 2012/0094429 A1* | 4/2012 | Juliano et al. | 438/95 |
| 2012/0227811 A1* | 9/2012 | Lau et al. | 136/262 |

\* cited by examiner

*Primary Examiner* — Asok K Sarkar
(74) *Attorney, Agent, or Firm* — The PL Law Group, PLLC

(57) ABSTRACT

A method of manufacturing an order vacancy compound (OVC) is provided. The method includes the following steps. A trivalent ion, a hexavalent ion and one of a univalent ion and a bivalent ion for an electrodeposition process are provided to form a solar energy absorbing film. The OVC is formed by performing an electrochemical etching process on the solar energy absorbing film.

18 Claims, 10 Drawing Sheets

```
Providing a trivalent ion, a hexavalent ion and
one of a univalent ion and a bivalent ion for       S101
an electrodeposition process to form a solar
energy absorbing film
                    ↓
Forming the OVC by performing an electrochemical    S102
etching process on the solar energy absorbing film
```

ORDER VACANCY COMPOUND AND METHOD OF MANUFACTURING THE SAME

FIELD OF THE INVENTION

The present invention is related to an order vacancy compound and method of manufacturing the same, and more particularly to manufacture an order vacancy compound by an electrochemical etching.

BACKGROUND

A method of manufacturing a solar energy absorbing film often includes an evaporation process, a sputtering process, or an electrodeposition process. The quality of the solar energy absorbing film formed by a co-evaporation process or a sputtering process in vacuum-based processes is superior than that of the solar energy absorbing film formed by a traditional electrodeposition. Moreover, the vacuum-based process can produce the solar energy absorbing film having compact, dense, crystalline, uniform, continuous and large grain-size characteristics. However, the apparatus of the vacuum processes is very expensive.

In those methods of manufacturing the solar energy absorbing film formed by a copper (Cu) element, an indium (In) element and a selenium (Se) element (CIS), one of them is to co-vapor the Cu, In elements firstly, and then anneals the Cu, In elements or a deposition layer formed by the Cu and In elements as a precursor. The co-evaporation includes two steps. Firstly, the Cu, the In and the Se are co-vapored to form a CIS layer, which is copper-rich on a substrate at a lower temperature (450° C.). Secondly, a thin film is deposited which is indium-rich on the CIS layer at higher temperature (550), and causing the CIG layer to lack the Cu as a whole for improving a filling factor of the solar energy absorbing film.

Another method of manufacturing the solar energy absorbing film is a selenium-combining process of a metal precursor layer. At first, the metal precursor layer is sputtered, vaporized, or electrodeposited, and then the selenium-combining is performed on the metal precursor layer by using a thin hydride selenium. The above method can improve a surface quality and reduce shallow defects, but the hydride selenium is a poisonous gas, and would be harmful to human health when the gas is leaked carelessly. Therefore, there is continuous improvement on new processing techniques, which fulfill the four criteria: the low cost, the high material yield, the scalability and the manufacturability.

The traditional electrodepositing process has a benefit of low cost; however, the quality of the solar energy absorbing film formed by the electrodepositing process is less superior to that of the solar energy absorbing film formed by the vacuum-based process, thereby resulting in a poor photoelectric conversion efficiency of the solar energy absorbing film.

If the defects in the solar energy absorbing film of the solar cell are too many, a mass recombination center will be formed therein by recombining electrons and electron holes which are excited by the sun light previously, and that will reduce a generation of a photo current and the photoelectric conversion efficiency of the solar cell. Thus, the amount of the defects in the solar energy absorbing film should be minimized as possible as it can be. However, when the solar energy absorbing film is manufactured by the traditional electrodepositing process, the defects and lots of voids can form a problem due to the inferior crystalline and the lack of the compaction.

In order to improve the quality of the solar energy absorbing film manufactured by the traditional electrodepositing process, one technique in prior art is to heat the solar energy absorbing film, and then an anneal process is adopted later. Another technique is to co-electrodeposit to form the CIS layer, and then an order vacancy compound (OVC) is sputtered or vaporized on the CIS by the vacuum-based process. For the methods in the prior art, such as the vacuum-based process or using different electrolytic solution to electrodeposit, no matter what technique is adopted, the last step is of sputtering or electrodepositing a rich indium on the CIS to improve a filling factor (FF) of the solar cell, and those techniques are too complex or expensive. For examples, after co-electrodepositing, the rich indium is sputtered on the CIS by the vacuum-based process to create the OVC, the vacuum-based technique still cost expensively. However, after co-electrodepositing, the rich indium is electrodeposited on the CIS by replacing the electrolytic solution, there is also a need to perform the anneal process for crystallizing.

SUMMARY

The aforementioned OVC forming by techniques of the vacuum-based process or the anneal process will form a contact resistance between a CIS interface and an OVC interface. Thus, if the OVC is formed from a primitive CIS in a process, the process will not only be simplified, but also can achieve the efficacy of improving the FF and the conversion efficiency of the solar cell as well.

In accordance with one aspect of the present invention, a method of manufacturing an order vacancy compound (OVC) is provided. The method comprises steps of providing a trivalent ion, a hexavalent ion and one of a univalent ion and a bivalent ion for an electrodeposition process to form a solar energy absorbing film, and forming the OVC by performing an electrochemical etching process on the solar energy absorbing film.

In accordance with one aspect of the present invention, an order vacancy compound (OVC) is provided. The OVC comprise a first N-type material and a P-type material. The first N-type material includes Cu—In—Se compound being indium-rich. The P-type material have component elements identical to those of the first N-type material, wherein the first N-type material and the P-type material form a P-N homo junction.

In accordance with one aspect of the present invention, a method of manufacturing an order vacancy compound (OVC) is provided. The method comprises steps of providing a precursor of the OVC, and performing an electrochemical etching process to the precursor of the OVC to form the OVC.

This invention provides an electrodeposit process to manufacture the CIS, and then an electrochemical etching is performed on the CIS to generate the OVC. The provided method can omit the step of electrodepositing indium-rich on the CIS. Additionally, manufacturing the OVC by the electrochemical etching applied to the primitive CIS can not only reduce cost, but also can increase the photoelectric conversion efficiency of the solar cell.

DETAILED DESCRIPTION

Figures 1, 2:
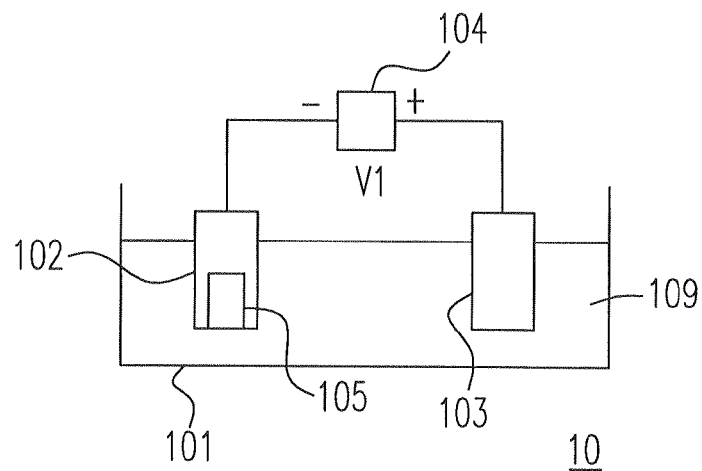
FIG. 1 shows the electrodeposition apparatus according to one embodiment of the present invention.
FIG. 2 shows a method for manufacturing an OVC in reference to FIG. 1.

Please refer to FIG. 1, which shows the electrodeposition apparatus 10 according to one embodiment of the present invention. The electrodeposition apparatus 10 includes an electrodeposition bath 101, a working electrode 102, an inertia electrode 103, and a power supply device 104. An electrolytic solution 109 which is preferred to be a conductive solution, for example, is poured into the electrodeposition bath 101. The inertia electrode 103 includes an inertia metal, which is difficult to generate an oxidation reduction reaction with the other substances. For example, the inertia metal is a platinum metal with a weak chemical activity or the like. A substrate can serve as the working electrode 102. The material of the substrate can be a molybdenum material on which the deposits including at least one of the copper, the indium and the selenium materials can be formed. While electrodepositing, the inertia electrode 103 serves as an electrodeposition anode, and the working electrode 102 serves as an electrodeposition cathode.

Please refer to FIG. 2, which shows a method for manufacturing an OVC in reference to FIG. 1. The method includes the following steps. In step S101, a trivalent ion, a hexavalent ion and one of a univalent ion and a bivalent ion for an electrodeposition process are provided to form a solar energy absorbing film. In step S102, the OVC is formed by performing an electrochemical etching process on the solar energy absorbing film.

For example, the compounds $CuCl_2$, $CuCl$, $In_3Cl$ and $SeO_3$ can provide the above ions when the compounds $CuCl_2$, $CuCl$, $In_3Cl$ and $SeO_3$ are dissolved in the electrolytic solution 109, such as $H_2SO_4$ or the like. The Compound $CuCl_2$ can provide the univalent ion $Cu^+$, the compound $CuCl$ can provide the bivalent ion $Cu^{2+}$, the compound $In_3Cl$ can provide the trivalent ion $In^{3+}$, and the compound $SeO_3$ can provide the hexavalent ion $Se^{6+}$. The chemical reaction rate of the compounds depends on a concentration of the electrolytic solution 109. Those ions $Cu^+$, $Cu^{2+}$, $In^{3+}$ and $Se^{6+}$ can get electrons to form Cu, Cu, In and Se by a reduction reaction resulting from the electrodeposition process, and then Cu, Cu, In and Se deposit on the working electrode.

In step S101, the power supply 104 applies a first voltage V1 between the inertia electrode 103 and the working electrode 102 for causing the electrical potential of the inertia electrode 103 to be greater than that of the working potential 102. The first voltage V1 is a positive voltage for examples. The working electrode 102 serves as an electrodeposition cathode, and provides electronics for reducing ions $Cu^+$, $Cu^{2+}$, $In^{3+}$ and $Se^{6+}$ in order to deposit the elements Cu, Cu, In and Se on the working electrode 103. The ions $Cu^+$, $Cu^{2+}$, $In^{3+}$ and $Se^{6+}$ have different reduction potentials, respectively. For instance, the reduction potential of Cu is 0.34 volt, the reduction potential of Se is 0.74 volt, and the reduction potential of In is −0.34 volt, the ions $Cu^+$, $Cu^{2+}$ and $Se^{6+}$ are reduced before the ions $In^{3+}$ is reduced. After depositing Cu, Cu, In and Se on the working electrode, a CIS 105 is formed to serve as a solar energy absorbing film.

Figure 3:
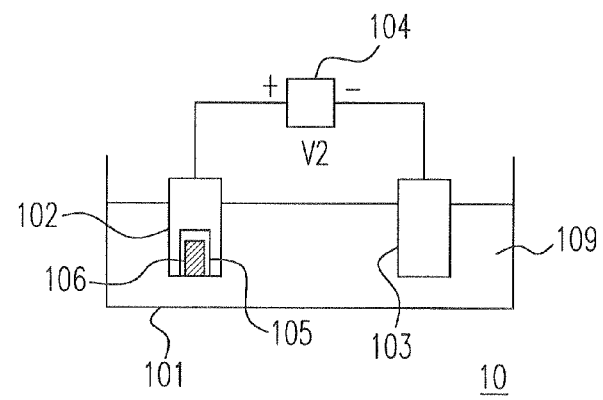
FIG. 3 shows the electrochemical etching process according to one embodiment of the present invention.

In step S102, the electrochemical etching process is a reverse process of the electrodeposition process. Please refer to FIG. 3, which shows the electrochemical etching process according to one embodiment of the present invention. After the electrodeposition process, the CIS 105 has been deposited on the working electrode 105. To proceed from step S101, next, the inertia electrode 103 serves as an electrochemical etching cathode, and the working electrode 102 serves as an electrochemical etching anode. By applying a second voltage V2 between the inertia electrode 103 and the working electrode 102, the potential of the inertia electrode 103 is smaller than that of the working electrode 102 for performing the electrochemical etching process. For example, the second voltage V2 is a negative voltage. When the electrochemical etching process is performed, the earlier reduced elements in the electrodepotition process are etched out; that is, at least one of the materials CuSe, $Cu_2Se$, and CuxSe is etched out from a surface of the CIS 105, and an indium-rich CIS film, which is an OVC 106, is remained.

The etching rate of the electrochemical etching can be adjusted according to the concentration of the electrolytic solution 109. The concentration of the electrolytic solution 109 affects the conductivity of the conductive solution, and further affects the etching rate of the electrochemical etching. The period of the electrochemical etching affects a thickness of the OVC 106. When the period of the electrochemical etching is too long, the thickness of the OVC 106 becomes small or even peels off. Therefore, the concentration of the electrolytic solution and the period of the electrochemical etching have important effects on the forming of the OVC 106. The other factor, such as the temperature or the stir, also affects the etching rate of the electrochemical etching. Heating the electrolytic solution 109 or providing ultra sonic to vibrate the electrolytic solution 109 can also increase the reaction rate.

In order to detect at what electric potential an electrochemical etching reaction is going to happen to the surface of the CIS 105 (i.e., the precursor of the OVC 106), a cyclic voltammetry can be applied for detecting at what electric potential an electrochemical etching reaction is going to happen to the precursor of the OVC 106.

Figure 4:
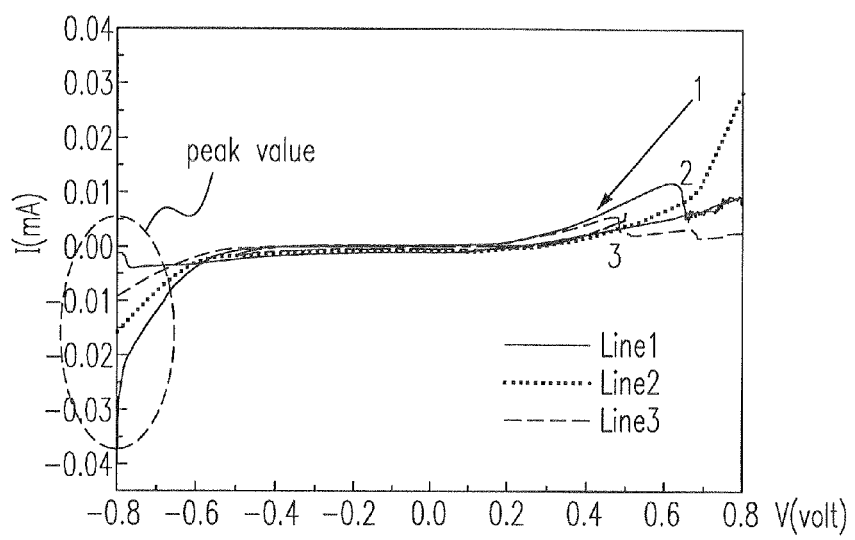
FIG. 4 shows the scans of the voltage and current of the cyclic voltammetry according to one embodiment of the present invention.

Please refer to FIG. 4, which shows the scans of the voltage and current of the cyclic voltammetry according to one embodiment of the present invention. The horizontal axis represents the second voltage V2, which has a unit being the volt. The perpendicular axis represents a current flowing from the working electrode 102 to the inertia electrode 103 through the electrodeposition bath 101, wherein the current has a unit being the milli-ampere. The inert electrode 103 serves as an electrochemical etching cathode, and the working electrode 102 serves as an electrochemical etching anode. A negative voltage drop, which is equal to the second voltage V2, is applied from the inertia electrode 103 to the working electrode 102. As shown in FIG. 4, a negative current peak having a current value of about −0.03 milli-ampere happens when the second voltage V2 has a voltage value of −0.8 volt. In order to do a cyclic scan, the second voltage V2, applied to the inertia electrode 103 with respect to the working electrode 102, is scanned from a positive voltage to a negative voltage by three times for the same conductive solution and the same CIS 105. Lines 1, 2 and 3 in FIG. 4 represent a first scan result having a first negative current peak value, a second scan result having a second negative current peak value and a third scan result having a third negative current peak value, respectively, and show that the first, the second and the third negative current peak values decreases sequentially from −0.03 milli-ampere to −0.01 milli-ampere. According to the above results, at least one of the compounds CuSe, $Cu_2Se$ and CuxSe in the surface of the CIS 105 is disappeared gradually, and an indium-rich CIS film is manufactured in the electrochemical etching process, wherein the indium-rich CIS film is the OVC 106.

Please refer to FIGS. 5(a)-5(e), which show five configurations of the CIS 105 in the electrochemical etching process according to one embodiment of the present invention, respectively. The electrochemical etching process is performed according to an elapsed time, and has the five configurations shown in FIGS. 5(a)-5(e) when the elapsed time of the electrochemical etching process for the CIS 105 has 5, 10, 15, 30 and 60 seconds corresponding to the configurations, respectively. FIG. 5 shows the OVC 106 formed on the surface of the CIS 105 when the elapsed time is equal to the time value of 5 seconds. According to the configurations shown in FIGS. 5(b)-5(e), the thickness of the OVC 106 becomes thinner. FIG. 5(f) shows that the thickness of the surface of the CIS 105 depends on the elapsed time of the electrochemical etching for the CIS 105 according to the configurations shown in FIGS. 5(b)-5(e). The horizontal axis represents the elapsed time of which unit is the second, and the elapsed time is also called a deplete time. The perpendicular axis represents the thickness of the surface of the CIS 105.

Figure 5A:
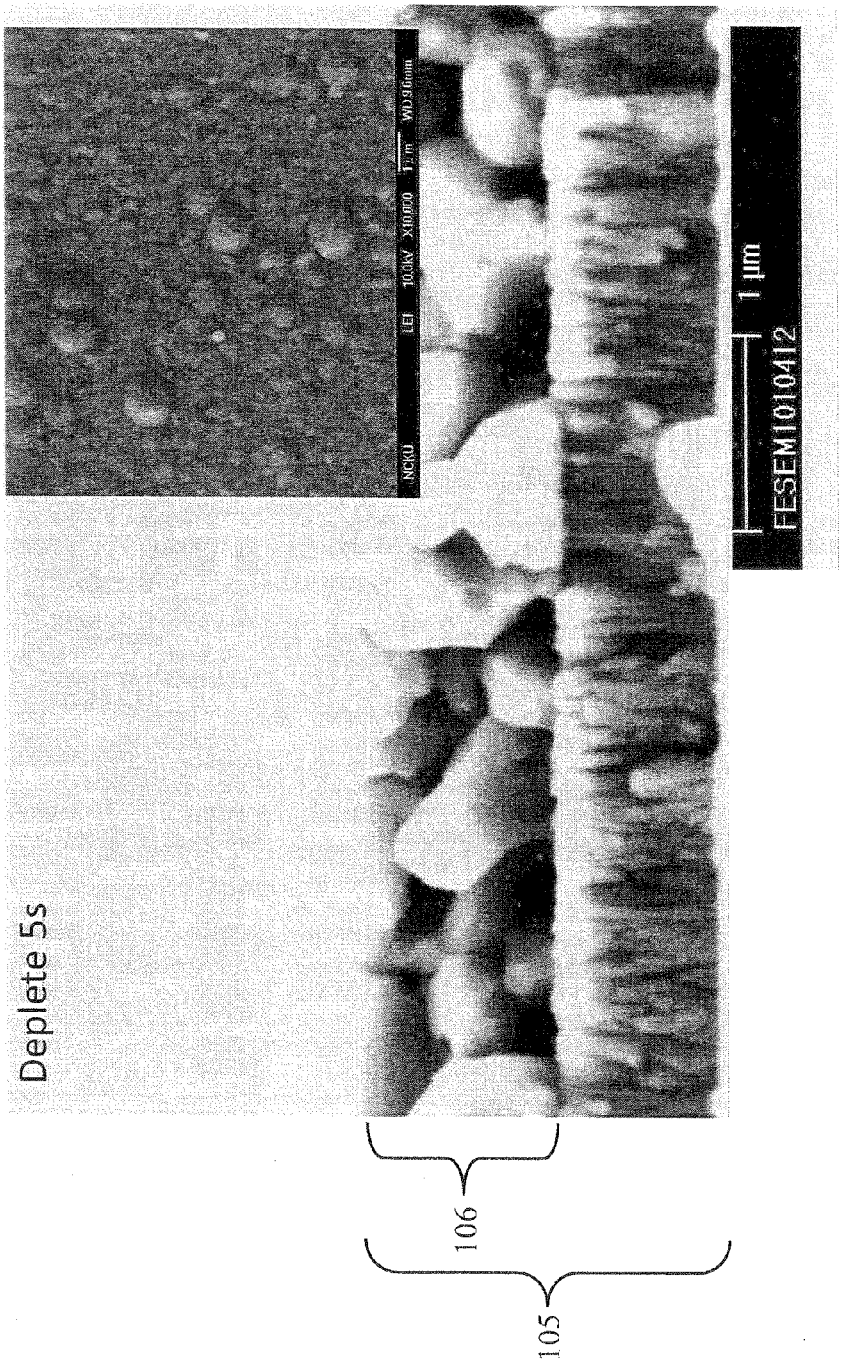
FIGS. 5(a)-5(e) show five configurations of the CIS in the electrochemical etching process according to one embodiment of the present invention, respectively.
Figure 5B:
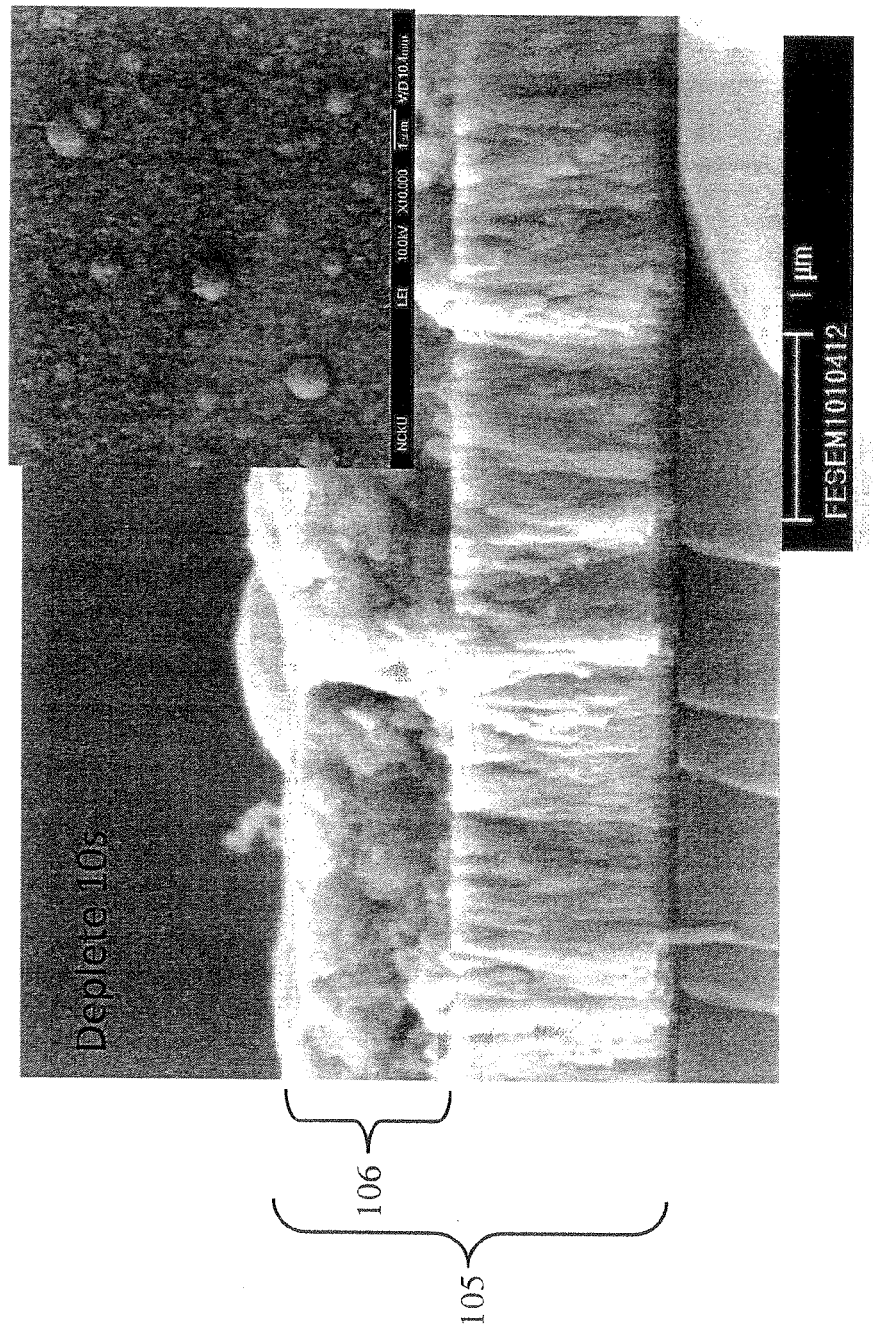
Figure 5C:
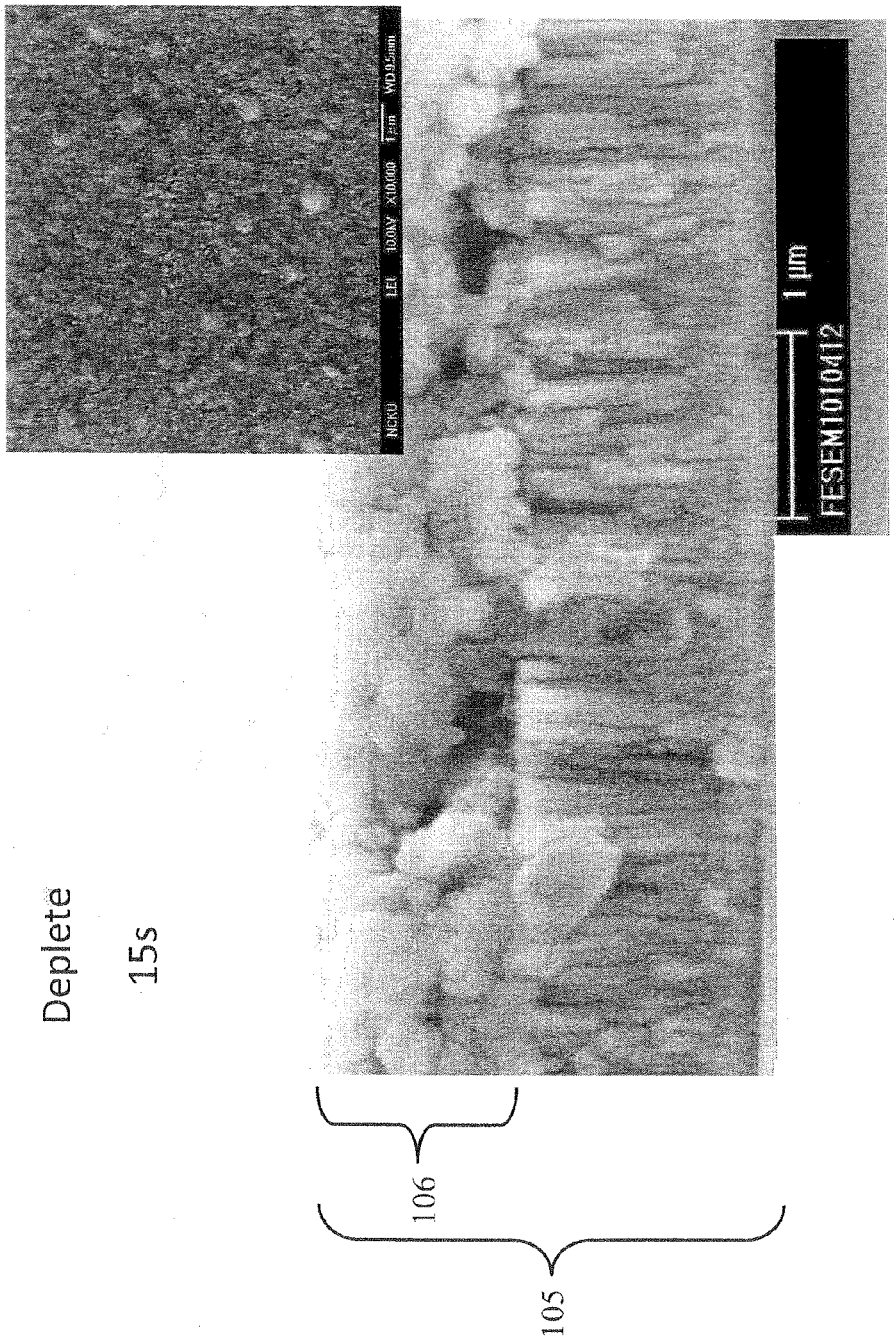
Figure 5D:
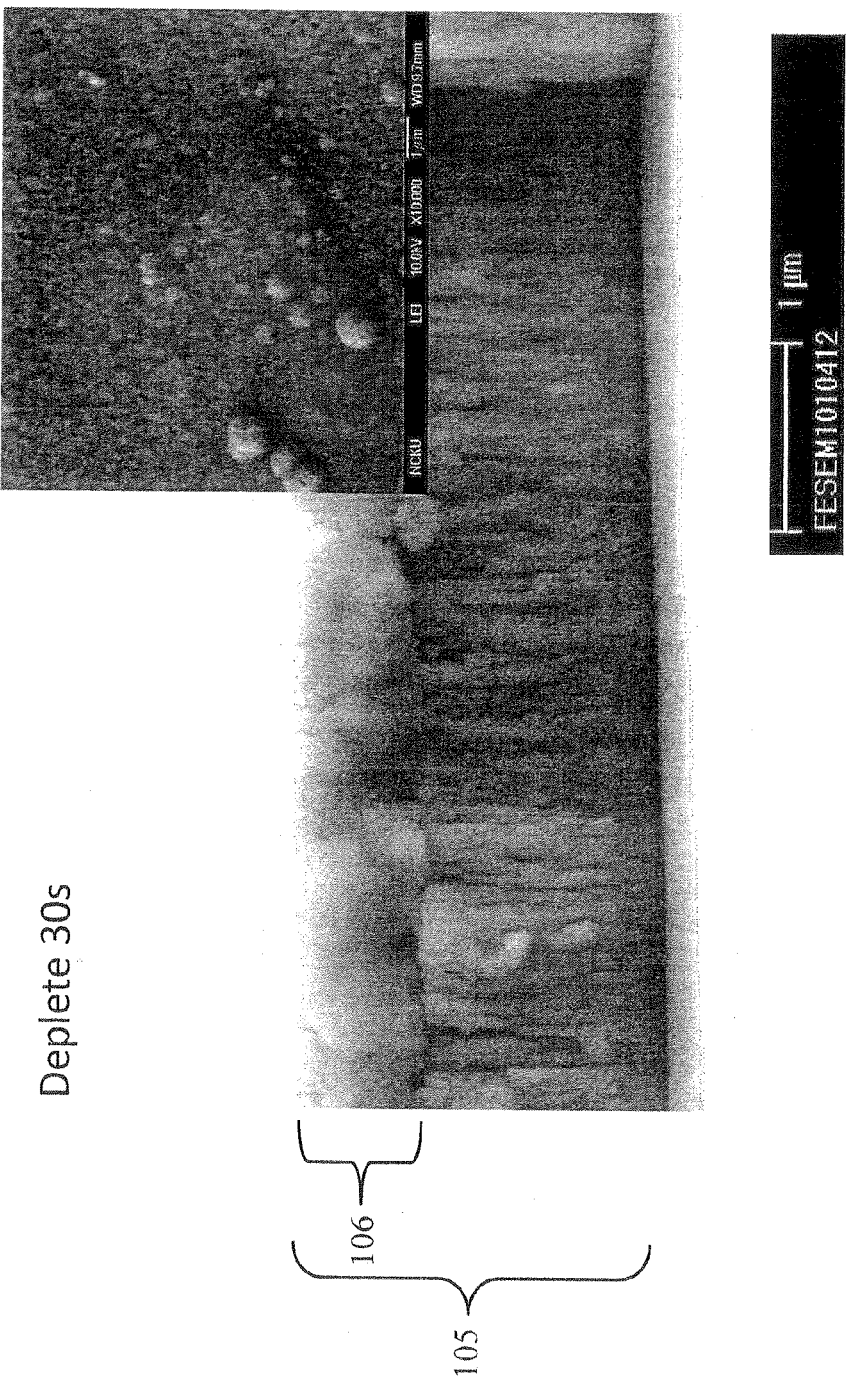
Figure 5E:
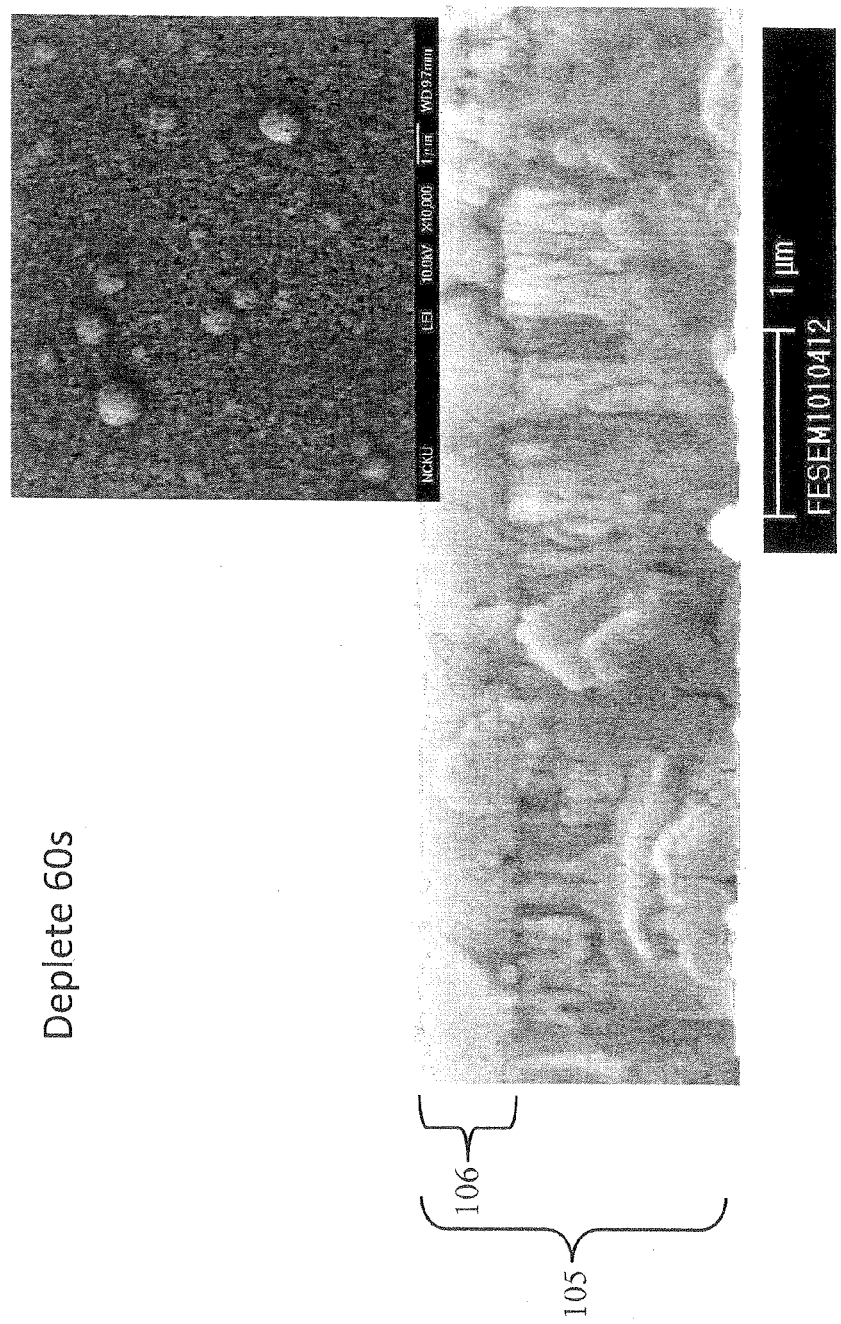
Figure 5F:
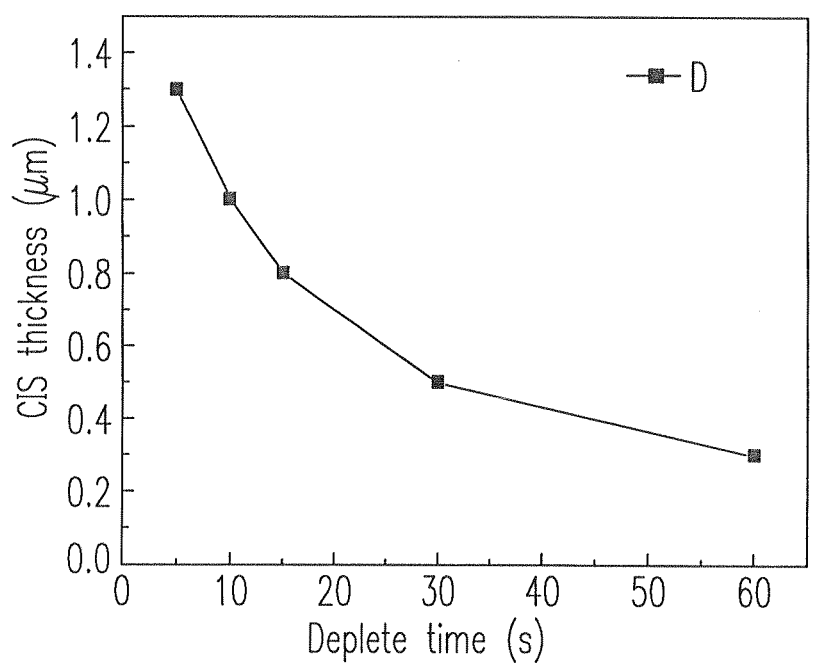
FIG. 5(f) shows the thickness of the surface of the CIS varies along with deplete time according to the configurations shown in FIGS. 5(b)-5(e)

In FIG. 5(a), it is found that a structure of a large grain size keeps in the OVC 106, and it means that at least one of the compounds CuSe, $Cu_2Se$ and CuxSe might be disappeared by the electrochemical etching process. Thus, the proportion of the copper to the indium is also changed.

Figure 6:
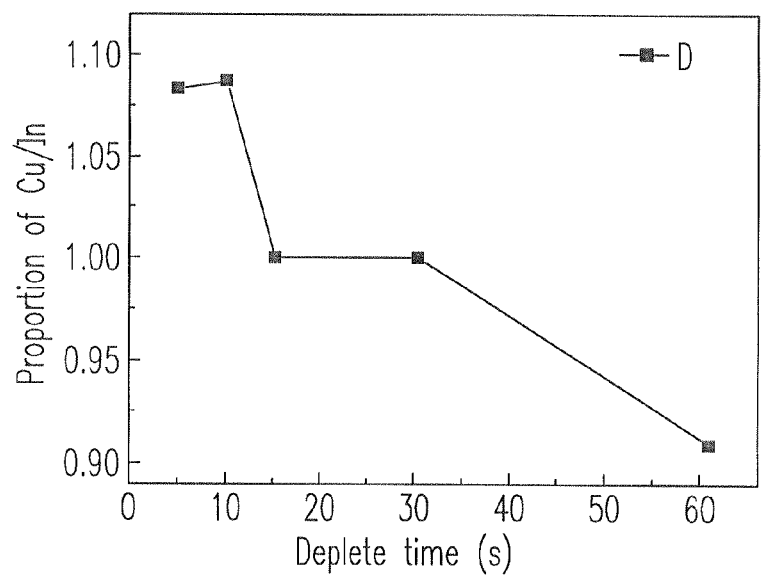
FIG. 6 shows the proportion change of the copper to the indium according to the configurations in FIGS. 5(b)-5(e)

Please refer to FIG. 6, which shows the proportion change of the copper to the indium according to the configurations in FIGS. 5(b)-5(e). The horizontal axis represents the elapsed time of the electrochemical etching of which unit is the second, and the elapsed time of the electrochemical etching is also called the deplete time. The perpendicular axis represents the proportion of the copper to the indium. The proportion is the value that the amount of the copper is divided by the amount of the indium. FIG. 6 shows that the proportion of the copper to the indium decreases when the elapsed time of the electrochemical etching goes longer. This means that at least one of the compounds CuSe, $Cu_2Se$ and CuxSe is disappeared gradually by the electrochemical etching process, and the proportion of the copper to the indium can be determined by controlling the elapsed time of the electrochemical etching.

Please refer to Table 1, which shows that the amount changes of the copper, the indium and the selenium depend on the elapsed time of the electrochemical etching.

TABLE 1

|  | Copper | Indium | Selenium |
| --- | --- | --- | --- |
| 5 seconds | 26 | 24 | 50 |
| 10 seconds | 25 | 23 | 52 |
| 15 seconds | 23 | 23 | 54 |
| 30 seconds | 22 | 22 | 56 |
| 60 seconds | 20 | 22 | 58 |

Figure 7:
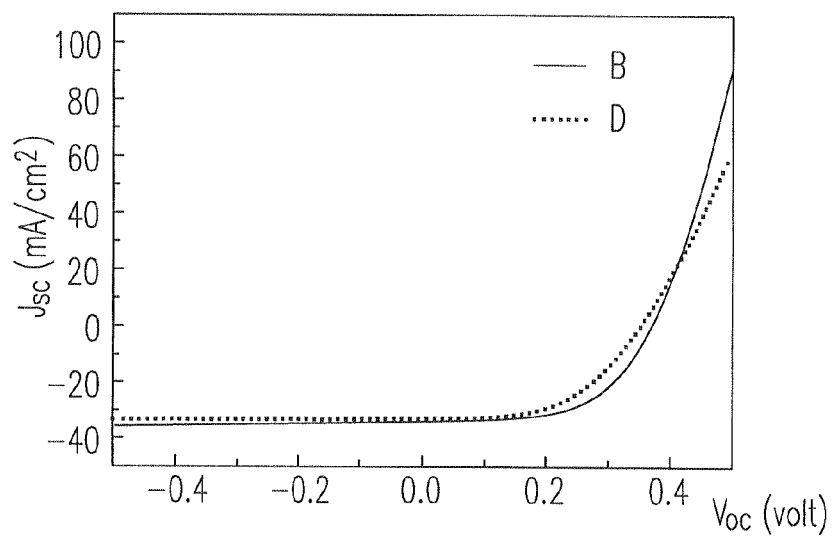
FIG. 7 shows the open voltage and the current density of the CIS according to the configurations in FIGS. 5(b)-5(e)

Please refer to FIG. 7, which shows the open voltage and the current density of the CIS 105 according to the configurations in FIGS. 5(b)-5(e). The horizontal axis represents the open voltage $V_{OC}$ of the CIS 105, and the unit of the open voltage $V_{OC}$ is the volt. The perpendicular axis represents the current density Jsc of the CIS 105, and the unit of the current density Jsc is the $mA/cm^2$. Line B shows the relationship between the current density Jsc and the open voltage $V_{OC}$ after the electrochemical etching is completed for the CIS 105. Line D shows the relationship between the current density Jsc and the open voltage $V_{OC}$ before the electrochemical etching is performed for the CIS 105.

FIG. 7 shows that the shape of Line B is similar to L shape more than Line D is. This represents the filling factor of Line B is much superior to that of Line D. The filling factor is increased from the filling factor value of 49% (for Line D) to the filling factor value of 56% (for Line B) so as to substantially achieve the efficacy of improving the filling factor and the transform efficiency.

Please refer to FIG. 1 again. In one embodiment, the CIS is formed by a co-electrodeposition process. In another embodiment of the present invention, a method for manufacturing an OVC can also be implemented. The copper, the indium and the selenium are electrodeposited on the working electrode 102 by a sequential order. The copper and the indium can be electrodeposited on the working electrode 102 first, and then the selenium is electrodeposited on the working electrode 102 later. The benefit of electrodepositing the copper and the indium first is that a liquid phase of the uniform metal can be formed on the surface of the CIS 105, and the liquid phase of the uniform metal causes the CIS 105 to have a high dense and continuous surface.

Figure 8:
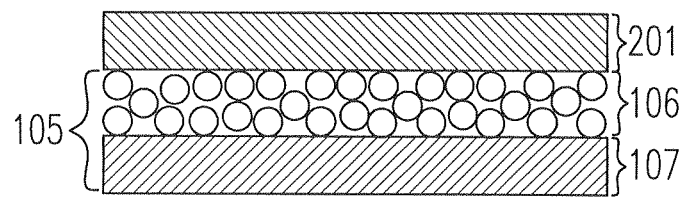
FIG. 8 shows the homogeny P-N material, and the non-homogeny N-type material according to one embodiment of the present invention.

Please refer to FIG. 8, which shows the homogeny P-N material, and the non-homogeny N-type material according to one embodiment of the present invention. Before the OVC 106 is formed, an N-type material 201 and a P-type material 107 are hetero. After the OVC 106 is formed, the P-type material 107 and the OVC 106, which is a N-type material, are homo. For example, the N-type material 201 is a cadmium sulfur (CdS) material. The ingredients of the P-type material 107 include the CIS compound, which has a chemical formula of such as $CuInSe_2$. The ingredients of the OVC 106 include the indium-rich CIS compound, which has a chemical formula of such as $CuIn_3Se_5$, and the OVC 106 covers the P-type material 107 to form a P-N homo junction. The P-type material 107 has component elements identical to those of the OVC 106, and has component elements non-identical to those of the N-type material 201 to form a P-N hetero junction.

A first interface energy band (not shown) of the OVC 106 and a second interface energy band (not shown) of the P-type material 107 are discontinuous. In the typical hetero structure for the solar energy, which is formed by the P-type material 107 and the N-type material 201, if a surface of the P-type material 107 is covered with the OVC 106 having indium-rich, a buried pseudo-homo junction can be formed in an internal part of the typical hetero structure. The buried pseudo-homo junction can result in discontinuousness of a hetero interface energy band for separating an optical-excited carrier, and thus can improve the efficacy of the solar cell. Meanwhile, the OVC 106 can prevent those electrons, excited by the sun light, from returning to valence band in order to avoid the light emitting due to the recombination, which is beneficial to separate the optical-excited carrier, so as to improve the photoelectric conversion efficiency of the solar cell.

Figure 9:
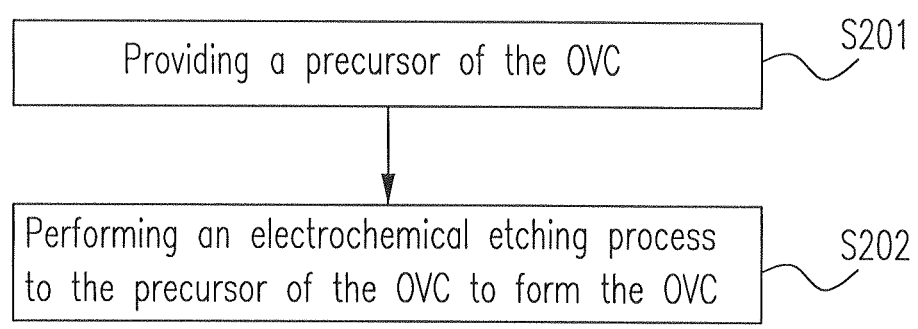
FIG. 9 shows a method for manufacturing the OVC 106 according to one embodiment of the present invention.

Please refer to FIG. 9, which show a method for manufacturing the OVC 106 according to one embodiment of the present invention. The method includes the following steps. In step S201, a precursor of the OVC 106 is provided. In step 202, an electrochemical etching process to the precursor of the OVC 106 is performed to form the OVC 106.

Embodiments

1. A method of manufacturing an order vacancy compound (OVC), comprising steps of: providing a trivalent ion, a hexavalent ion and one of a univalent ion and a bivalent ion for an electrodeposition process to form a solar energy absorbing film; and forming the OVC by performing an electrochemical etching process on the solar energy absorbing film.

2. The method of embodiment 1, wherein the electrodeposition process includes a co-electrodeposition process.

3. The method of embodiments 1-2, wherein the electrodeposition process comprises a step of: providing a conductive solution as an electrolytic solution, an inertia electrode as an anode, and a working electrode as a cathode.

4. The method of embodiments 1-3, further comprising steps of: adjusting a concentration of the conductive solution for controlling a rate of the electrochemical etching process; and adjusting an etching time of the electrochemical etching process for determining a thickness of the OVC.

5. The method of embodiments 1-4, wherein the solar energy absorbing film has a surface, which the OVC is formed on.

6. The method of embodiments 1-5, wherein one of the univalent ion and the bivalent ion includes copper cation, the bivalent ion includes indium cation, and the hexavalent ion includes selenium cation.

7. The method of embodiments 1-6, wherein the OVC is indium-rich.

8. The method of embodiments 1-7, wherein the electrodeposition process comprises steps of: providing a halogen ion; providing a conductive solution as an electrolytic solution, an inertia electrode as an electrodeposition anode, and a working electrode as an electrodeposition cathode; applying a first voltage between the inertia electrode and the working electrode; and causing the inertia electrode to have an higher electric potential than that of the working electrode for reducing firstly one of the univalent ion and the bivalent ion, secondly the trivalent ion, and thirdly the hexavalent ion to form the solar energy absorbing film on the working electrode.

9. The method of embodiments 1-8, further comprising steps of: selecting the inertia electrode as an etching cathode, and the working electrode as an etching anode; and applying a second voltage between the inertia electrode and the working electrode in order to cause the electric potential of the inertia electrode to be lower than that of the working electrode for performing the electrochemical etching process; adjusting a concentration of the conductive solution for controlling a rate of the electrochemical etching process; and adjusting an etching time of the electrochemical etching process for determining a thickness of the OVC, wherein the halogen ion includes a chloride.

10. An order vacancy compound (OVC), comprising: a first N-type material including Cu—In—Se compound being indium-rich; and a P-type material having component elements identical to those of the first N-type material, wherein the first N-type material and the P-type material form a P-N homo junction.

11. The OVC of embodiments 10, wherein the first N-type material is formed by an electrochemical etching; and the first N-type material covers the P-type material.

12. The OVC of embodiments 10-11, wherein the first N-type material and the P-type material have respectively interface energy bands, which are discontinuous.

13. The OVC of embodiments 10-12, wherein the P-type material is combined with a second N-type material to form a P-N hetero junction; and the component elements of the first N-type material are different from those of the second N-type material.

14. The OVC of embodiments 10-13, wherein the P-type material contains less indium percentage than the first N-type material, and the second N-type material includes Cadmium sulfide.

15. A method of manufacturing an order vacancy compound (OVC), comprising steps of: providing a precursor of the OVC; and performing an electrochemical etching process to the precursor of the OVC to form the OVC.

16. The method of embodiment 15, further comprising: detecting at what electric potential an electrochemical etching reaction is going to happen to the precursor of the OVC by a cyclic voltammetry (CV).

17. The method of embodiments 15-16, wherein the detecting step comprises sub-steps of: providing a conductive solution as an electrochemical etching solution, an inertia electrode as an electrochemical etching cathode, and a working electrode as an electrochemical etching anode; and applying an increasing voltage between the inertia electrode and the working electrode in order to cause the inertia electrode to have an electric potential lower than that of the working electrode until the electrochemical etching reaction happens to the precursor of the OVC for performing the electrochemical etching process.

18. The method of embodiments 15-17, further comprising steps of: adjusting a concentration of the conductive solution for controlling a rate of the electrochemical etching process; and adjusting an etching time of the electrochemical etching process for determining a thickness of the OVC.

19. The method of embodiments 15-18, wherein: the precursor of the OVC includes a solar energy absorbing film; and the electrochemical etching process generates the OVC to being indium-rich.

20. The method of embodiments 15-19, further comprising steps of: preparing the precursor of the OVC by an electrodeposition process including a sub-step of: providing a conductive solution as an electrolytic solution, an inertia electrode as an electrodeposition anode, and a working electrode as a electrodeposition cathode; and forming the OVC on a surface of the solar energy absorbing film.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method of manufacturing an order vacancy compound (OVC), comprising:
  providing a trivalent ion, a hexavalent ion and one of a univalent ion and a bivalent ion for an electrodeposition process to form a solar energy absorbing film, wherein one of the univalent ion and the bivalent ion includes a copper cation, the trivalent ion includes an indium cation, and the hexavalent ion includes a selenium cation; and
  forming the OVC by performing an electrochemical etching process on the solar energy absorbing film for etching out the copper cation and the selenium cation, wherein the OVC is indium-rich, and a P-N homo junction is formed in the solar energy absorbing film.

2. A method of claim 1, wherein the electrodeposition process includes a co-electrodeposition process.

3. A method of claim 1, wherein the electrodeposition process comprises:
providing a conductive solution as an electrolytic solution, an inertia electrode as an anode, and a working electrode as a cathode.

4. A method of claim 1, further comprising:
adjusting a concentration of the conductive solution for controlling a rate of the electrochemical etching process; and
adjusting an etching time of the electrochemical etching process for determining a thickness of the OVC.

5. A method of claim 1, wherein the solar energy absorbing film has a surface, which the OVC is formed on.

6. A method of claim 1, wherein the electrodeposition process comprises:
providing a halogen ion;
providing a conductive solution as an electrolytic solution, an inertia electrode as an electrodeposition anode, and a working electrode as an electrodeposition cathode;
applying a first voltage between the inertia electrode and the working electrode; and
causing the inertia electrode to have higher electric potential than that of the working electrode for reducing firstly one of the univalent ion and the bivalent ion, secondly the trivalent ion, and thirdly the hexavalent ion to form the solar energy absorbing film on the working electrode.

7. A method of claim 6, further comprising:
selecting the inertia electrode as an etching cathode, and the working electrode as an etching anode; and
applying a second voltage between the inertia electrode and the working electrode in order to cause the electric potential of the inertia electrode to be lower than that of the working electrode for performing the electrochemical etching process;
adjusting a concentration of the conductive solution for controlling a rate of the electrochemical etching process; and
adjusting an etching time of the electrochemical etching process for determining a thickness of the OVC, wherein the halogen ion includes a chloride.

8. An order vacancy compound (OVC), comprising:
a first N-type material including Cu—In—Se compound being indium-rich by etching out 1:1 copper cation and a selenium cation of the Cu—In—Se compound; and
a P-type material having component elements identical to those of the first N-type material, wherein the first N-type material and the P-type material form a P-N homo junction and the P-type material is combined with a second N-type material to form a P-N hetero junction opposite to the P-N homo junction.

9. An OVC of claim 8, wherein the first N-type material is formed by an electrochemical etching; and
the first N-type material covers the P-type material.

10. An OVC of claim 8, wherein the first N-type material and the P-type material have respective interface energy bands, which are discontinuous.

11. An OVC of claim 8, wherein:
the component elements of the first N-type material are different from those of the second N-type material.

12. An OVC of claim 8, wherein the P-type material contains less indium percentage than the first N-type material, and the second N-type material includes Cadmium sulfide.

13. A method of manufacturing an order vacancy compound (OVC), comprising:
providing a precursor of the OVC including an earlier reduced element and a later reduced element, wherein the later reduced element is an indium cation; and
performing an electrochemical etching process to the precursor of the OVC for etching out the earlier reduced element and for forming the OVC on the precursor of the OVC, wherein the electrochemical etching process renders the OVC indium-rich and a P-N homo junction is formed in the precursor of the OVC and the OVC.

14. A method of claim 13, further comprising:
detecting at what electric potential an electrochemical etching reaction is going to happen to the precursor of the OVC by a cyclic voltammetry (CV).

15. A method of claim 14, wherein the detecting step comprises:
providing a conductive solution as an electrochemical etching solution, an inertia electrode as an electrochemical etching cathode, and a working electrode as an electrochemical etching anode; and
applying an increasing voltage between the inertia electrode and the working electrode in order to cause the inertia electrode to have an electric potential lower than that of the working electrode until the electrochemical etching reaction happens to the precursor of the OVC for performing the electrochemical etching process.

16. A method of claim 15, further comprising:
adjusting a concentration of the conductive solution for controlling a rate of the electrochemical etching process; and
adjusting an etching time of the electrochemical etching process for determining a thickness of the OVC.

17. A method of claim 13, wherein:
the precursor of the OVC includes a solar energy absorbing film.

18. A method of claim 17, further comprising:
preparing the precursor of the OVC by an electrodeposition process including:
providing a conductive solution as an electrolytic solution, an inertia electrode as an electrodeposition anode, and a working electrode as a electrodeposition cathode; and
forming the OVC on a surface of the solar energy absorbing film.

* * * * *